United States Patent
Park et al.

(10) Patent No.: US 8,379,456 B2
(45) Date of Patent: Feb. 19, 2013

(54) NONVOLATILE MEMORY DEVICES HAVING DUMMY CELL AND BIAS METHODS THEREOF

(75) Inventors: Chan Park, Gwangju (KR); Changseok Kang, Seongnam-si (KR); Sung-Il Chang, Hwaseong-si (KR); Youngwoo Park, Seoul (KR); Jongsun Sel, Hwaseong-si (KR); Jintaek Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 197 days.

(21) Appl. No.: 12/901,605

(22) Filed: Oct. 11, 2010

(65) Prior Publication Data

US 2011/0085385 A1 Apr. 14, 2011

(30) Foreign Application Priority Data

Oct. 14, 2009 (KR) .................. 10-2009-0097729
Oct. 14, 2009 (KR) .................. 10-2009-0097732

(51) Int. Cl.
*G11C 11/34* (2006.01)

(52) U.S. Cl. ......... 365/185.22; 365/185.18; 365/185.29; 365/189.05

(58) Field of Classification Search ............ 365/185.22, 365/185.18, 189.05, 185.29
See application file for complete search history.

(56) References Cited

U.S. PATENT DOCUMENTS

| | | | |
|---|---|---|---|
| 6,031,759 A | 2/2000 | Ohashi | |
| 6,185,131 B1 | 2/2001 | Kouchi | |
| 6,829,171 B2 * | 12/2004 | Ooishi | 365/185.21 |
| 7,342,843 B2 * | 3/2008 | Takeuchi et al. | 365/225.7 |
| 7,379,333 B2 | 5/2008 | Lee et al. | |
| 7,518,920 B2 * | 4/2009 | Kang | 365/185.17 |
| 7,570,517 B2 | 8/2009 | Kwak et al. | |
| 2007/0070699 A1 | 3/2007 | Lee | |
| 2009/0168532 A1 | 7/2009 | Sel et al. | |

FOREIGN PATENT DOCUMENTS

| | | |
|---|---|---|
| JP | 11-260070 | 9/1999 |
| JP | 2000-339979 | 12/2000 |
| JP | 2006-114078 | 4/2006 |
| JP | 2006-127749 | 5/2006 |
| JP | 2007-096301 | 4/2007 |
| KR | 109990077647 A | 10/1999 |
| KR | 1020060052142 A | 5/2006 |
| KR | 1020070034712 A | 3/2007 |
| KR | 100729365 B1 | 6/2007 |
| KR | 1020090064927 A | 6/2009 |

* cited by examiner

*Primary Examiner* — Son Dinh

(74) *Attorney, Agent, or Firm* — Myers Bigel Sibley & Sajovec

(57) ABSTRACT

Provided are nonvolatile memory devices and methods of operating thereof. The nonvolatile memory devices include: dummy cells connected to a dummy bit line; and a dummy bit line bias circuit providing a dummy bit line voltage to the dummy bit line during a program operation, wherein, due to the dummy bit line voltage, at least one of the dummy cells is programmed with a threshold voltage lower than the top programmed state and higher than an erased state during the program operation.

19 Claims, 19 Drawing Sheets

(0 < V_DBL < Vcc)

Fig. 4

|  | Program | Erase | Read |
|---|---|---|---|
| SSL | Vcc | Floating | Vread |
| Selected WL | Vpgm | 0 | Vrd |
| Unselected WL | Vpass |  | Vread |
| GSL | 0 | Floating | Vread |
| CSL | ~2V | Floating | 0 |
| BL(program) | 0 | Floating | Measure |
| BL(Inhibit) | Vcc |  |  |
| DBL | $V_{DBL}$ | Floating | 0 |

$(0 < V_{DBL} < Vcc)$

|  | Program | Erase | Read |
|---|---|---|---|
| SSL | Vcc | Floating | Vread |
| Selected WL | Vpgm | 0 | Vrd |
| Unselected WL | Vpass |  | Vread |
| GSL | 0 | Floating | Vread |
| CSL | V$_{CSL}$ | Floating | 0 |
| BL(program) | 0 | Floating | Measure |
| BL(Inhibit) | Vcc | | |
| DBL | V$_{CSL}$ | Floating | 0 |

NONVOLATILE MEMORY DEVICES HAVING DUMMY CELL AND BIAS METHODS THEREOF

CROSS-REFERENCE TO RELATED APPLICATIONS

This U.S. non-provisional patent application claims priority under 35 U.S.C. §119 of Korean Patent Application Nos. 10-2009-0097729, filed on Oct. 14, 2009, and 10-2009-0097732, filed on Oct. 14, 2009, the entire contents of which are hereby incorporated by reference as if set forth fully herein.

BACKGROUND

The present disclosure herein relates to semiconductor memory devices, and more particularly, to nonvolatile memory devices and methods of operating thereof.

In general, semiconductor memory devices are largely classified into volatile memory devices and nonvolatile memory devices. The volatile semiconductor memory device has a fast read or write speed but loses its stored contents when external power supply is cut off. On the contrary, the nonvolatile semiconductor memory device retains its stored contents even if external power supply is cut off. Therefore, the nonvolatile semiconductor memory device may be used to memorize the contents that need to be stored regardless of power supply. The nonvolatile semiconductor memory device may include a mask read-only memory (MROM), a Programmable read-only memory (PROM), an erasable programmable read-only memory (EPROM), and an electrically erasable programmable read-only memory (EEPROM).

Generally, MROM, PROM, and EPROM may have difficulties performing erase and write operations without additional devices and thus general users may have difficulties updating their memory contents. On the contrary, EEPROM is capable of electrically performing ease and write operations and thus becomes extensively applied to system programming or an auxiliary memory device, which requires continuous update. A flash EEPROM (hereinafter, referred to as a flash memory) has a higher degree of integration than a typical EEPROM and thus may be advantageous to an application requiring a high capacity auxiliary memory device. Among flash memories, a NAND type flash EEPROM (hereinafter, referred to as a NAND-type flash memory) has a higher degree of integration than other flash memories.

A flash memory device based on the above-mentioned EEPROM technology may store a large amount of information. Then, the flash memory device may read stored information at any time. Due to a demand for a high capacity of a flash memory device, the degree of integration in memory cells has been increased. Moreover, many efforts are being made to store multi-bit data in one memory cell in order to achieve high capacity.

Furthermore, due to the high capacity, interference between memory cells may increasingly affect performance of the memory cells. Reliability of data is affected by interference between memory cells and dummy cells and between bit lines and dummy bit lines.

SUMMARY

The present disclosure provides nonvolatile memory devices for preventing interference caused by a dummy string and operating methods thereof.

Embodiments of the present invention provide nonvolatile memory devices that include multiple dummy cells connected to a dummy bit line and a dummy bit line bias circuit providing a dummy bit line voltage to the dummy bit line during a program operation. In some embodiments, due to the dummy bit line voltage, at least one of the dummy cells is programmed with a threshold voltage lower than the top programmed state and higher than an erased state during the program operation.

Some embodiments provide that the dummy bit line voltage is lower than a gate voltage of a selection transistor for selecting the plurality of dummy cells during the program operation. In some embodiments, the dummy bit line voltage is higher than a ground voltage during the program operation. Some embodiments provide that the dummy bit line voltage is the same as a common source line voltage for providing a source voltage of the dummy cells during the program operation. In some embodiments, the dummy line bias circuit is a common source line circuit for providing the common source line voltage.

Some embodiments provide that the dummy bit line bias circuit maintains the dummy bit line in a floating state during an erase operation. In some embodiments, the dummy bit line bias circuit provides a ground voltage (0 V) to the dummy bit line during a read operation.

Some embodiments include control logic that is operative to control a bias operation on a dummy bit line of the dummy bit line bias circuit according to an operating mode. In some embodiments, data stored by programming of the dummy cells is invalid. A read operation on the dummy cells may be blocked.

Some embodiments of the present invention include methods of biasing a nonvolatile memory device. Methods may include providing a first voltage to a dummy bit line connected to a dummy cell and applying a program voltage to a gate of the dummy cell. The first voltage may be lower than a second voltage that is provided to a bit line of a cell string that is to be program-inhibited. In some embodiments, the first voltage is higher than a third voltage provided to a bit line of a cell string that is to be programmed.

Some embodiments include applying the first voltage to a drain of the dummy cell through a selection transistor and applying the second voltage to a gate of the selection transistor. In some embodiments, a source of the dummy cell is electrically disconnected to a common source line and the first voltage may be the same as a voltage of the common source line.

Some embodiments include a nonvolatile memory device that includes a dummy cell connected to a dummy bit line and a page buffer connected to the dummy bit line. Control logic may be operable to load dummy data into the page buffer connected to the dummy bit line during a program operation so that the dummy cell is programmed with a programmed state lower than the top programmed state and lower than an erased state. In some embodiments, the dummy data is generated by the control logic.

Some embodiments provide that the page buffer connected to the dummy bit line senses the dummy bit line to verify whether the dummy cell is programmed with the programmed state or not during the program operation. In some embodiments, the control logic is operable to determine whether the dummy cell is programmed with the programmed state or not with reference to the sensing result outputted from the page buffer connected to the dummy bit line. The control logic may be operable to terminate the program operation of the dummy cell when it is determined that the dummy cell is programmed with the programmed state.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 4 is a table illustrating a bias state of a nonvolatile memory device;

DETAILED DESCRIPTION

Figure 1:
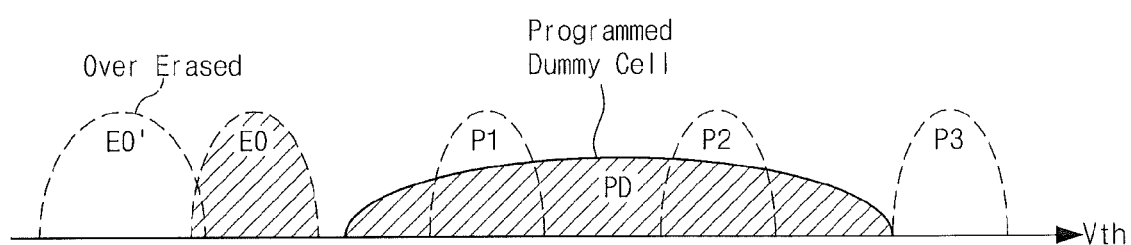
FIG. 1 is a view illustrating s threshold voltage distribution of dummy cells.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Below, a NAND flash memory device is used as one example for illustrating characteristics and functions of the inventive concept. However, those skilled in the art can easily understand other advantages and performances of the inventive concept according to the descriptions. For example, PRAM, MRAM, ReRAM, FRAM, and/or NOR flash memories may be used as storage medium and may be applied to a memory system with different kinds of memory devices. The inventive concept may be embodied or applied through other embodiments. Besides, the detailed description may be amended or modified according to viewpoints and applications, not being out of the scope, technical idea and other objects of the inventive concept.

FIG. 1 is a view illustrating a threshold voltage distribution of dummy cells according to some embodiments of the present invention. As an example, a threshold voltage distribution of a nonvolatile memory device (where 2-bit data is stored in one memory cell) is illustrated.

In a case of a 2-bit multi level cell (MLC), memory cells for storing data are programmed with one of four programmed states (E0, P1, P2, and P3). That is, a threshold voltage of memory cells corresponds to one of four programmed states (E0, P1, P2, and P3) by a program operation. In addition, a threshold voltage of programmed memory cells shifts to an erased state E0 during an erase operation. According to some embodiments of the present invention, a threshold voltage of dummy cells corresponds to one of an erased state E0 and a dummy state PD indicated with a slant line.

In a flash memory device, if memory cells have a different threshold voltage from an adjacent memory cell, they affect each other. That is, floating gates of adjacent memory cells having respectively different threshold voltages exchange interference. Interference may include program disturbance or lateral charge spreading. According to this inference between adjacent cells, a threshold voltage of a memory cell may be increased or decreased in an unintentional direction. Especially, this interference phenomenon occurs significantly between memory cells programmed with an erased state E0 and memory cells programmed with a programmed state P3 having the top threshold voltage.

Especially, interference caused by dummy cells becomes an issue in a flash memory device including the dummy cells. Dummy cells in series are connected between select transistors SST and GST. Dummy cells and select transistors SST and GST constitute one dummy string. Then, a dummy string is connected to a dummy bit line. The dummy string may be formed adjacent to a normal string (a cell string having valid data). Memory cells in the normal string and memory cells in the dummy string may exchange mutual interference.

A dummy bit line may be connected to a pocket p-well (hereinafter, referred to as PPW) or may be configured to be maintained in a floating state. If a dummy bit line is connected to PPW, dummy cells are programmed during a program operation. However, a program verify operation for dummy cells is not provided. Accordingly, even if dummy cells are programmed with an appropriate voltage, they are not set as program inhibit. In this case, dummy cells may be programmed to have a threshold voltage of the top state (e.g., P3) or a threshold voltage higher than the top state. In addition, if dummy cells float electrically, they may not be programmed but exposed to a repetitive erase operation. If the dummy cells are exposed to the repetitive erase operation, a threshold voltage of the dummy cells may shift to an over-erased state E0'.

However, according to some embodiments of the present invention, a threshold voltage of dummy cells is distributed in an erased state E0 and a dummy state PD. Accordingly, general inter-cell interference such as program disturbance and/or lateral charge leakage can be prevented. Here, for convenience of description, although a 2-bit MLC is illustrated as one example, the same technical feature as the inventive concept may be applied to an MLC of more than 3 bits.

Figure 2:
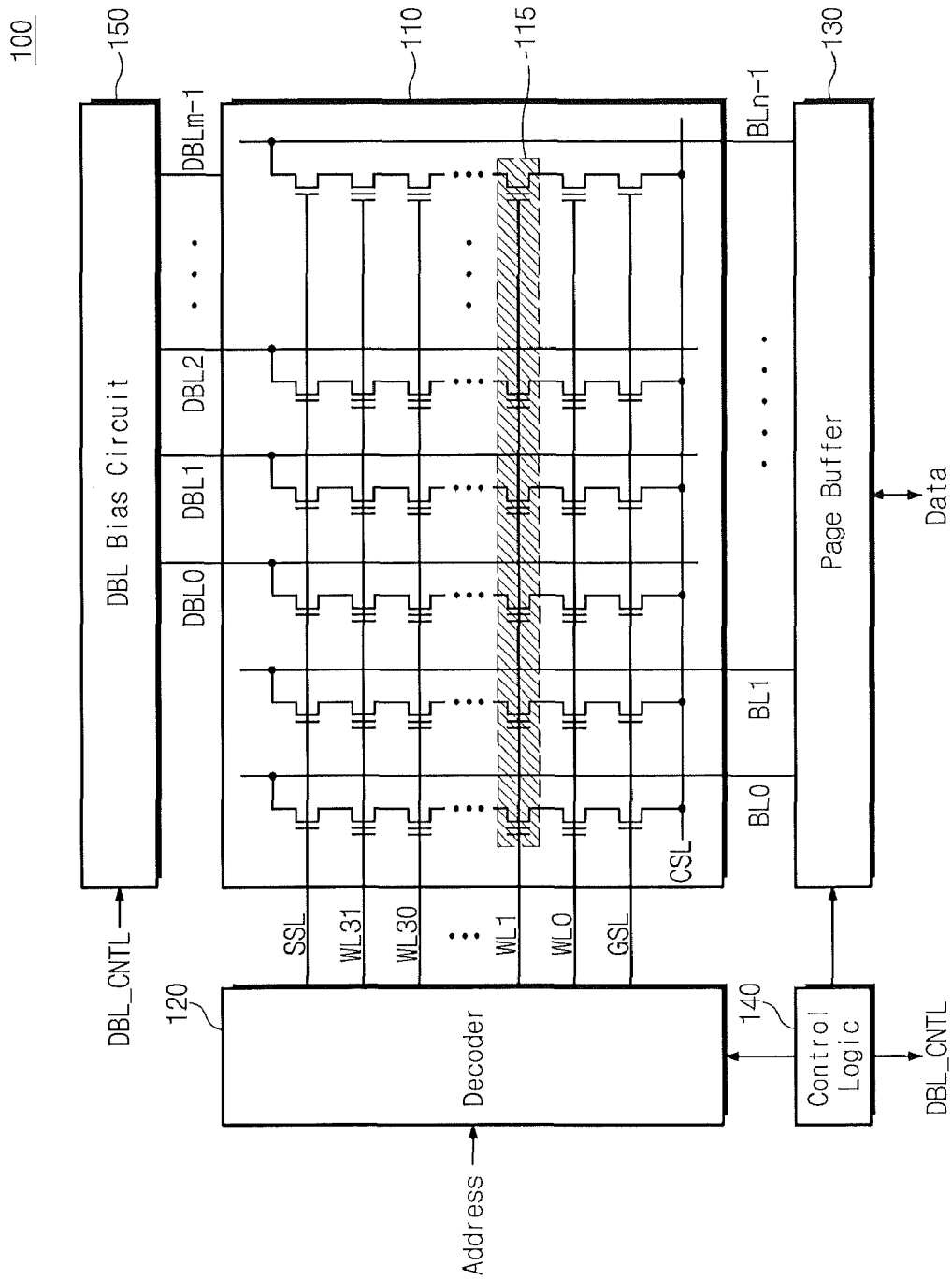
FIG. 2 is a block diagram of a nonvolatile memory device according to some embodiments of the present invention.

FIG. 2 is a block diagram of a nonvolatile memory device 100 according to some embodiments of the present invention. Referring to FIG. 2, the nonvolatile memory device 100 includes a cell array 110, a decoder 120, a page buffer 130, a control logic 140, and a dummy bit line bias circuit 150.

The cell array 110 may include a plurality of memory blocks. One memory block is illustrated as one example in FIG. 2. Each memory block may include a plurality of pages. Each page (for example, 115) may include a plurality of memory cells. In the nonvolatile memory device 100, an erase operation is performed by a memory block and a write or read operation is performed by a page unit. The cell array 110 may include dummy cells. Dummy cells are connected to the dummy lines DBL0, DBL1, and DBL2. The dummy cell does not store valid data.

The cell array 110 has a cell string structure. One cell string includes a string selection transistor SST connected to a string selection line SSL, a plurality of memory cells connected to a plurality of word lines WL0 to WL31, and a ground selection transistor GST connected to the ground selection line GSL. The string selection transistor SST is connected to a bit line BL and a ground selection transistor GST is connected to a common source line CSL.

A plurality of memory cells are connected to one word line WL1. A group of memory cells connected to one word line and programmed simultaneously is called a page typically. For example, when one page 115 is programmed, a program voltage Vpgm and a verify voltage are alternately provided to the word line WL1. Then, during a program operation, program data is provided to bit lines connected to the selected page 115. In order to perform a verify operation, bit lines connected to each memory cell of the selected page 115 are pre-charged. Then, a voltage shift of the pre-charged bit line is sensed. Based on the sensed voltage shift of the bit line, it is determined whether memory cells are programmed successfully or not.

The decoder 120 is connected to the cell array 110 through selection lines such as SSL, GSL, or word lines WL0 to WL31. During a program or read operation, the decoder 120 receives an address and selects one of word lines (for example WL1). In addition, the decoder 120 delivers a necessary voltage for a program or read operation to the selected word line WL1 or non-selected word line (except for WL1).

The page buffer 130 is connected to the cell array 110 through bit lines BL0 to BLn-1. The page buffer 130 receives data and delivers the received data to the selected page 115 during a program operation. The page buffer 130 reads data from the selected page 115 and outputs the read data to the external during a read operation.

The page buffer 130 may temporarily store data to be programmed in the selected page 115 or data read from the selected page 115. The page buffer 130 delivers program data to the bit lines BL0 to BLn-1 during a program execution operation. Then, the page buffer 130 senses memory cells in the selected page 115 through a bit line during a program verify operation. The page buffer 130 pre-charges the bit lines in order to sense whether memory cells are programmed or not at a high speed. The page buffer 130 senses a voltage shift of the pre-charged bit lines BL0 to BLn-1 to sense whether memory cells in the selected page 115 are programmed or not.

The control logic 140 may control program, read, and erase operations of the nonvolatile memory device 100. For example, during a program operation, the control logic 140 controls the decoder 120 to provide a program voltage to a selected word line. The control logic 140 may control the page buffer 130 to provide program data to the selected page 115.

The dummy bit line bias circuit 150 may bias a dummy bit line according to a control DBL_CNTL or an operating mode of the control logic 140. The dummy bit line bias circuit 150 biases the dummy bit lines DBL0 to DBLm−1 to erase dummy cells in an erased state E0 during a block erase operation. That is, if the dummy bit line is set in a floating state, an erase voltage Verase applied to the PPW may be applied to the dummy bit lines DBL0 to DBLm−1. During a read operation, the dummy bit line bias circuit 150 may apply 0 V to the dummy bit lines DBL0 to DBLm−1.

The dummy bit line bias circuit 150 provides a dummy bit line voltage $V_{DBL}$ to the dummy bit lines DBL0 to DBLm−1 during a program operation. Dummy cells are programmed into the dummy state PD (see FIG. 1) through the dummy bit line voltage $V_{DBL}$. The dummy bit line voltage $V_{DBL}$ is higher than a ground voltage 0 V. Then, the dummy bit line voltage $V_{DBL}$ is lower than a bit line voltage (a program inhibit voltage, for example, Vcc) that is provided for program inhibit.

The nonvolatile memory device 100 according to some embodiments of the present invention controls a dummy bit line according to each operating mode. As a result, the nonvolatile memory device 100 may prevent a phenomenon that a threshold voltage of dummy cells shifts to an over-erased state E0' during an erase operation. The nonvolatile memory device 100 prevents a phenomenon that dummy cells are programmed with an over-programmed state or the top state P3 during a program operation. By managing the above dummy cells, interference that dummy cells affect normal cells can be prevented.

Figure 3:
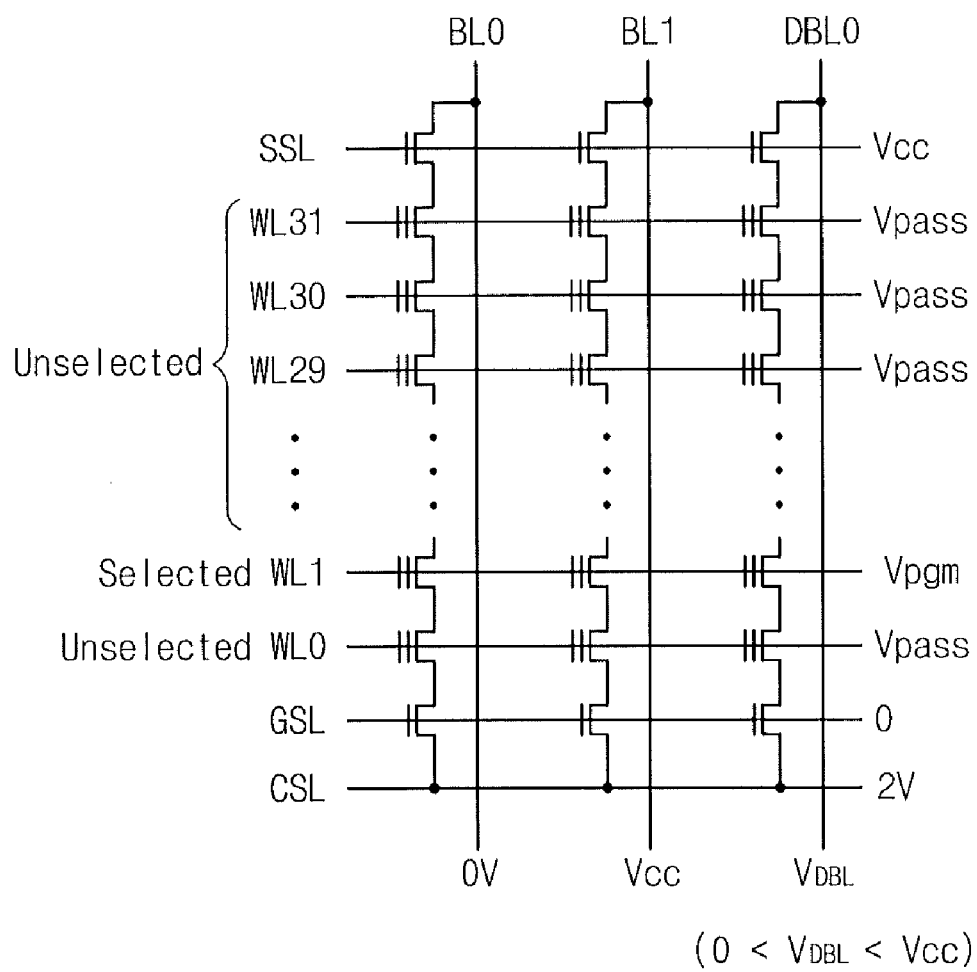
FIG. 3 is a circuit diagram illustrating a bias state of a nonvolatile memory device.

FIGS. 3 and 4 are views illustrating a bias state of the nonvolatile memory device 100 of FIG. 2. A circuit diagram of FIG. 3 illustrates a bias voltage of word lines and bit lines during a program operation.

During a program operation, a power voltage Vcc may be provided to a string selection line SSL, and a ground voltage (e.g., 0 V) may be provided to a ground selection line GSL, and a source line voltage (e.g., about 2 V) may be provided to a common source line CSL. Then, a ground voltage (or, 0 V) is applied to a program bit line BL0. A power voltage Vcc may be applied to a program inhibited bit line BL1. In addition, a dummy bit line voltage $V_{DBL}$ is applied to a dummy bit line DBL0. During this state, a pass voltage Vpass or a program voltage Vpgm is applied to word lines.

Here, the dummy bit line voltage $V_{DBL}$ is a voltage having a magnitude with which dummy cell is programmed into the dummy state PD of FIG. 1. For example, a dummy bit line voltage $V_{DBL}$ having a lower level than a voltage (for example, Vcc) supplied to the string selection line SSL may be provided. When a dummy bit line voltage $V_{DBL}$ is provided during a program operation, a channel of a dummy cell string does not float and is fixed with a level of the dummy bit line voltage $V_{DBL}$. During this state, when a program voltage Vpgm is provided to the selected bit line, dummy cells are programmed with the dummy state PD. Here, the dummy bit line voltage $V_{DBL}$ is higher than a program bit line voltage (for example, 0 V) provided to a program bit line (for example, BL0).

During an erase operation, word lines are biased to 0 V and the selection lines SSL and GSL are biased to electrically float. Then, the bit lines BL and DBL and the common source line CSL are biased to a floating state. In the above bias state, an erase voltage Verase is provided to an erase PPW.

During a read operation, a selection read voltage Vrd is provided to a selection word line and a non-selection read voltage Vread is provided to the non-selection word lines and selection lines SSL and GSL. Then, a common source line and a dummy bit line may be biased to 0 V. During this bias state, bit lines are sensed.

Figure 5A:
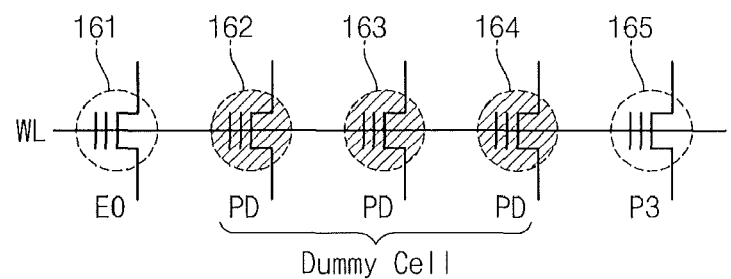
FIGS. 5A and 5B are views illustrating a state of dummy cells programmed according to some embodiments of the present invention.
Figure 5B:
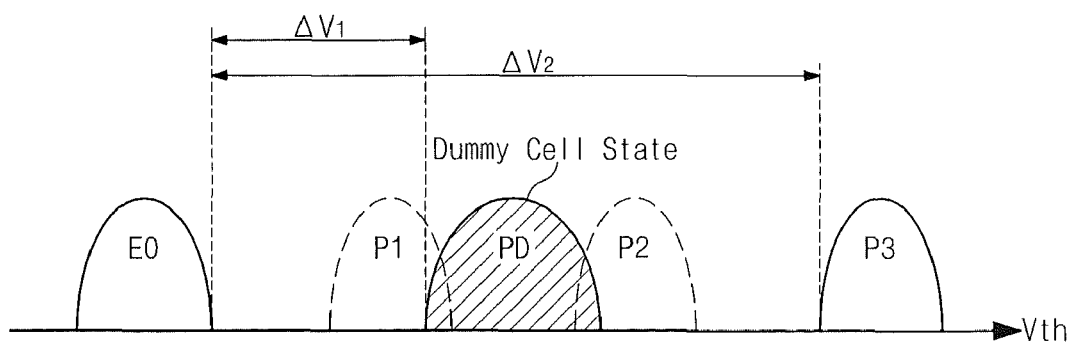

FIGS. 5A and 5B are views illustrating a state of programmed dummy cells according to some embodiments of the present invention. Referring to FIG. 5A, dummy cells 162, 163, and 164 are programmed with a dummy state PD. Then the memory cells 161 and 165 adjacent to dummy cells are programmed with an erased state E0 and the top programmed state P3, respectively.

Referring to FIG. 5B, the dummy state PD is disposed at the middle of a range between the erased state E0 and the top programmed state P3. The memory cell 161 programmed with the erased state E0 may be free from a phenomenon that adjacent dummy cell 162 is over-programmed. Moreover, the memory cell 165 programmed with the top programmed state P3 may be free from a phenomenon that a threshold voltage of the adjacent dummy cell 164 is excessively low.

As the degree of integration is increased, interference between adjacent memory cells is increased in the nonvolatile memory device 100. For example, similar to program disturbance or lateral charge spreading, a threshold voltage of a memory cell may be increased or decreased according to a threshold voltage of an adjacent memory cell. In particular, this lateral charge spreading or program disturbance occurs significantly between memory cells programmed with an erased state E0 and memory cells programmed with a programmed state P3 having the top threshold voltage.

Dummy cells may not be programmed and may be exposed to a repetitive erase operation. Accordingly, dummy cells may be easily over-erased. In this regard, dummy cells that are programmed without an application of a program verify operation may be easily over-programmed. Accordingly, memory cells adjacent dummy cells may be seriously exposed to interference. According to some embodiments of the present invention, over-erased or over-programmed phenomenon of dummy cells may be prevented. Accordingly, interference that normal memory cells receive from dummy cells can be prevented.

Figure 6:
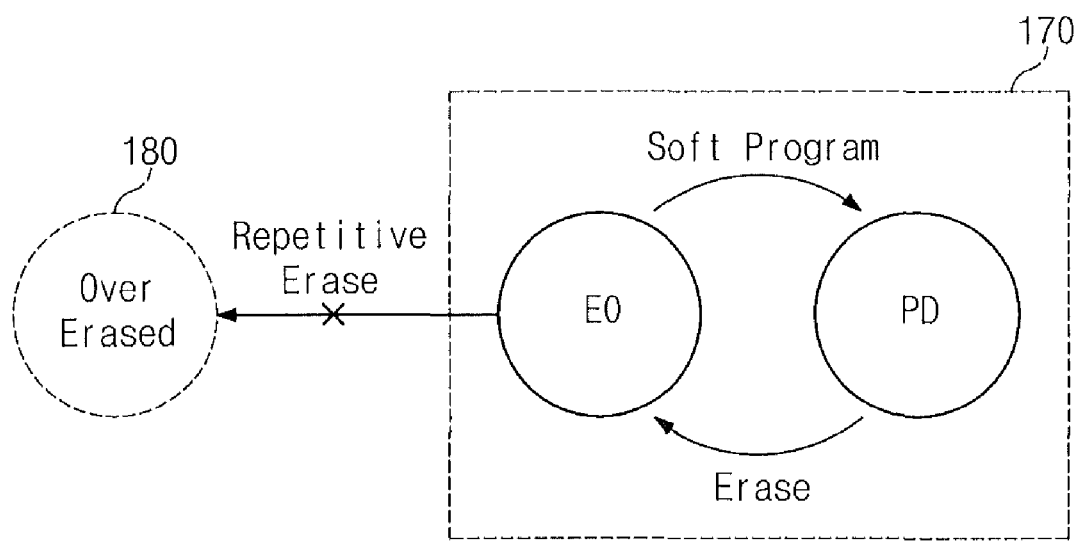
FIG. 6 is a view illustrating a state transition of dummy cells according to some embodiments of the present invention.

FIG. 6 is a view illustrating a state transition property of dummy cells according to some embodiments of the present invention. Referring to FIG. 6, dummy cells of the nonvolatile memory device 100 are prevented from a repetitive erase operation. As used herein, the repetitive erase operation means that dummy cells are continuously exposed only during a block erase operation. Accordingly, a phenomenon that dummy cells are erased with an over-erased state E0 can be prevented fundamentally. That is, in relation to a charge-trap type flash memory, excessive holes are injected in a charge trap layer of dummy cells, such that a phenomenon that affects a charge trap layer of adjacent normal memory cells can be prevented. Moreover, although not illustrated in the drawing, a phenomenon that dummy cells are programmed with the top state (for example, P3) or an over-programmed state can be prevented.

In the nonvolatile memory device 100 according to some embodiments of the present invention, state transition occurs only between an erased state E0 and a dummy state PD of dummy cells. This state transition between the closed program and erase operations of dummy cells is indicated with an identification number 170.

Figure 7:
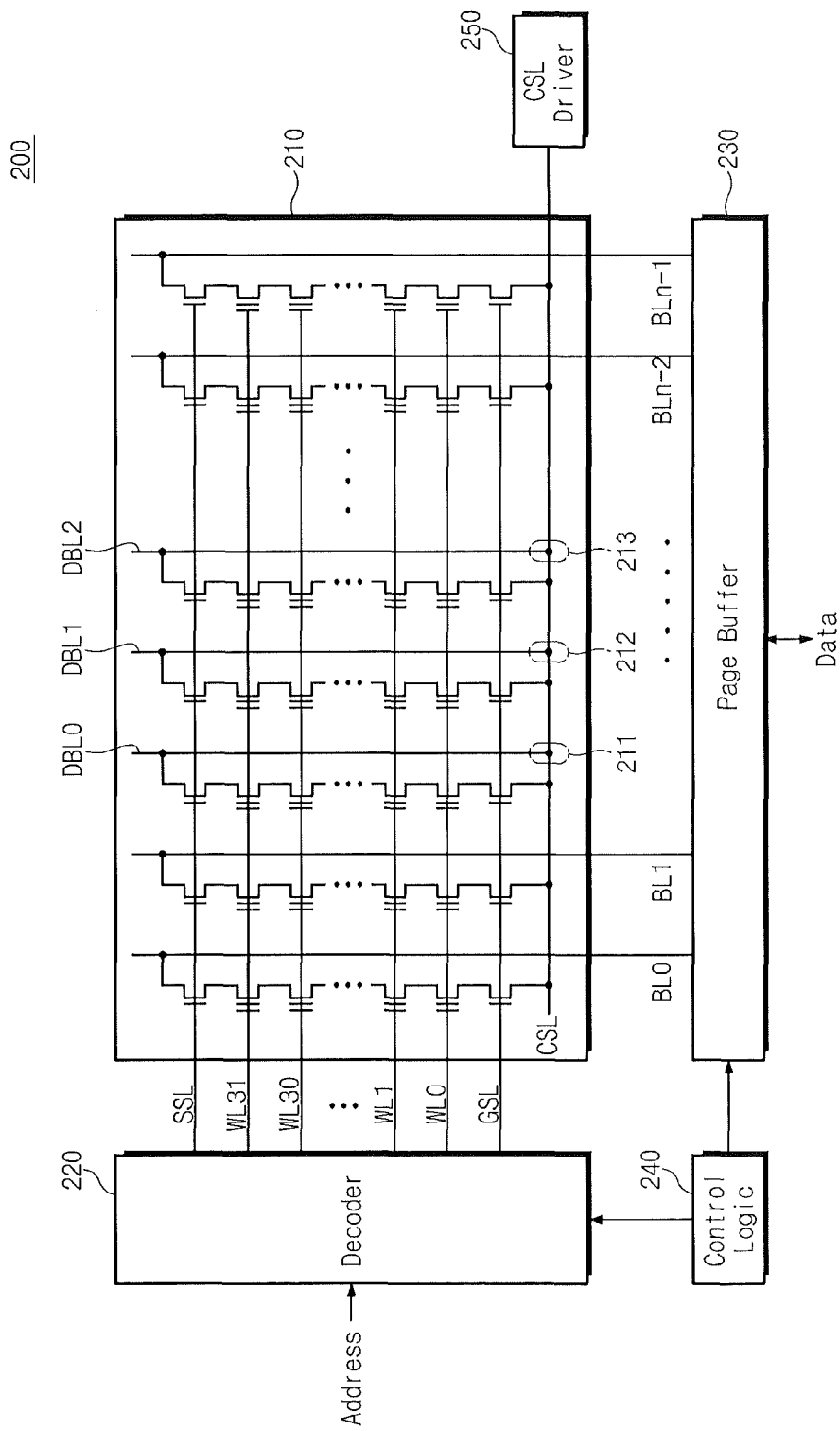
FIG. 7 is a block diagram of a nonvolatile memory device according to some embodiments of the present invention.

FIG. 7 is a block diagram of a nonvolatile memory device 200 according to some embodiments of the present invention. Referring to FIG. 7, a nonvolatile memory device 200 includes a cell array 210, a decoder 220, a page buffer 230, control logic 240, and a common source line driver 250. The decoder 220, the page buffer 230, and the control logic 240 are substantially the same as the components of FIG. 2 and thus their description will be omitted.

The cell array 210 may include a plurality of memory blocks. One memory block is illustrated as an example in FIG. 7. Each memory block may include a plurality of pages. Each page includes a plurality of memory cells. In the nonvolatile memory device 200, an erase operation is performed by a memory block and a write or read operation is performed by a page unit. The cell array 210 may include dummy cells. Dummy cells are connected to the dummy lines DBL0, DBL1, and DBL2. The dummy cell does not store valid data.

The cell array 210 has a cell string structure. One cell string includes a string selection transistor SST (FIG. 8) connected to a string selection line SSL, a plurality of memory cells connected to a plurality of word lines WL0 to WL31, and a ground selection transistor GST (FIG. 8) connected to the ground selection line GSL. The string selection transistor SST is connected to a bit line BL and a ground selection transistor GST is connected to a common source line CSL.

A plurality of memory cells are connected to one word line WL1. A program voltage Vpgm and a verify voltage are alternately provided to the word line WL1 that program one page. Then, during a program operation, program data is provided to bit lines connected to a selected page. In order to perform a verify operation, bit lines connected to each memory cell of the selected page are pre-charged. Then, a voltage shift of the pre-charged bit line is sensed. Based on the sensed voltage shift of the bit line, it is determined whether memory cells are programmed successfully or not.

The cell array 210 according to an embodiment of the inventive concept includes dummy cells. Dummy cells constitute a dummy string and dummy strings are connected to the dummy lines DBL0, DBL1, and DBL2, respectively. Then, each of the dummy bit lines DBL0, DBL1, and DBL2 is electrically connected to the common source line CSL. The dummy bit lines DBL0, DBL1, and DBL2 are connected to the common source line CSL through contacts 211, 212, and 213, respectively.

As a result, general bias conditions of the dummy bit lines DBL0, DBL1, and DBL2 are the same as the common source line CSL. That is, during a program operation, a source line voltage VCSL (about 2 V) supplied to the common source line CSL is provided to the dummy bit lines DBL0, DBL1, and DBL2. Dummy cells connected to the dummy bit lines DBL0, DBL1, and DBL2 receive the source line voltage VCSL and are programmed with the dummy state PD as described above regarding FIG. 1. The source line voltage VCSL is higher than a ground voltage 0 V. The source line voltage VCSL is lower than a bit line voltage (a program inhibit voltage, for example, Vcc) provided for program inhibit.

The common source line driver 250 biases a common source line CSL according to each operating mode. For example, during a program operation, a source line voltage VCSL is provided to a common source line CSL. During an erase operation, the common source line driver 250 maintains a common source line CSL in a floating state. During a read operation, the common source line driver 250 may provide 0 V or a ground voltage to the common source line CSL.

The dummy bit lines DBL0, DBL1, and DBL2 are biased identical to the common source line CSL during program, erase, and read operating modes. By providing the same bias condition as the common source line CSL, a phenomenon that dummy cells are erased in the over-eased state E0' of FIG. 1 can be prevented. Also, by providing the same bias condition as the common source line CSL, a phenomenon that dummy cells are programmed in the over-programmed state of FIG. 1 or the top state P3 can be prevented.

Figure 8:
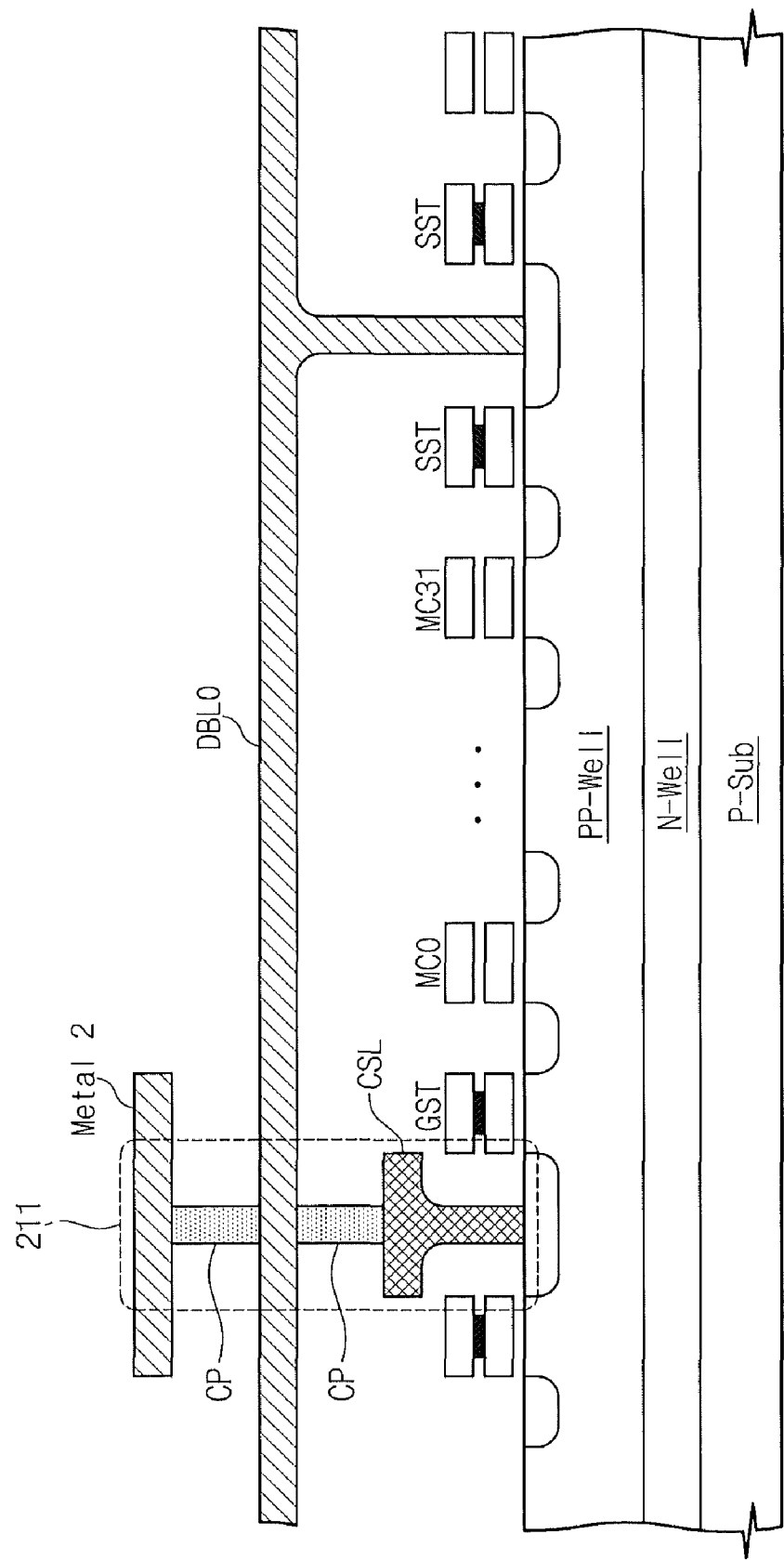
FIG. 8 is a sectional view of a dummy string of FIG. 7.

FIG. 8 is a sectional view illustrating the contacts 211, 212, and 213 of the dummy bit lines DBL0, DBL1, and DBL2 and the common source line CSL. For example, a sectional view of a dummy string including the contact 211 between the dummy bit line DBL1 and the common source line CSL is illustrated. The common source line CSL and the dummy bit line DBL0 are electrically connected to a metal line Metal 2 for providing a voltage of the common source line CSL. In order to form a contact between the metal line Metal 2, the common source line CSL, and the dummy bit line DBL0, a contact plug CP may be vertically formed. A common source line voltage VCSL applied through the metal line Metal 2 is delivered to the dummy bit line DBL1. During a program operation, the same voltage as the common source line CSL is provided to the dummy bit line DBL0.

Figures 9, 10:
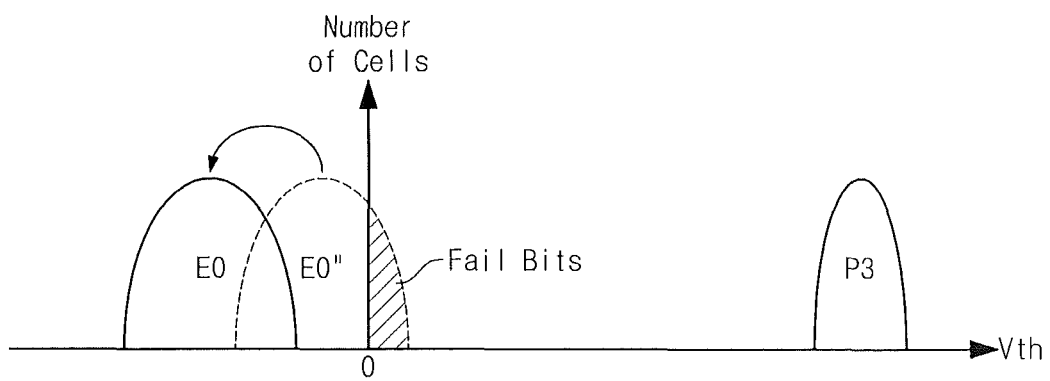
FIG. 9 is a table illustrating a bias state of a nonvolatile memory device of FIG. 7.
FIG. 10 is a view illustrating an effect of the present invention.

FIG. 9 is a table illustrating a bias voltage of the nonvolatile memory device 200 of FIG. 7. Referring to FIG. 9, the same voltage VCSL as the common source line CSL is provided to the dummy bit line DBL during a general operating mode of the nonvolatile memory device 200 of FIG. 7.

During a program operation, a power voltage Vcc may be provided to the string selection line SSL and a ground voltage (or, 0 V) may be provided to the ground selection line GSL. Then a ground voltage (or, 0 V) is applied to a program bit line BL1. A power voltage Vcc may be applied to a program inhibited bit line BL1. Then, a common source line voltage VCSL may be simultaneously applied to the common source line CSL and dummy bit line DBL. During this state, a pass voltage Vpass or a program voltage Vpgm is applied to the word lines.

Here, by a common source line voltage VCSL (about 2 V) applied to a dummy bit line, dummy cells are programmed into the dummy state PD of FIG. 1. For example, a common source line voltage VCSL (about 2 V) having a lower level than a voltage (for example, Vcc) supplied to the string selection line SSL may be provided. Then, a channel of a dummy string does not float and is fixed with a level of the common source line voltage VCSL. During this state, when a program voltage Vpgm is provided to the selected bit line, dummy cells are programmed with the dummy state PD. Here, the common source line voltage VCSL is higher than a program bit line voltage (for example, 0 V) provided to the program bit line.

During an erase operation, word lines are biased to 0 V and the selection lines SSL and GSL are biased to electrically float. Then, the bit lines BL and DBL and the common source line CSL are biased to a floating state. During the above bias state, an erase voltage Verase is provided to an erase PPW.

During a read operation, a selection read voltage Vrd is provided to a selection word line and a non-selection read voltage Vread is provided to the non-selection word lines and selection lines SSL and GSL. Then, the common source line CSL and the dummy bit line DBL may be biased to 0 V. During this bias state, memory cells selected through bit lines will be sensed.

FIG. 10 is a view illustrating effects according to some embodiments of the present invention. Referring to FIG. 10, a phenomenon that a threshold voltage of memory cells shifts to a distorted erased state E0' including fail bits caused by interference can be prevented. That is, according to some embodiments of the present invention, a phenomenon that an erased state E0 of adjacent normal cells is distorted by an over-erase or over-program of dummy cells can be prevented.

According to the above-mentioned embodiments, dummy cells are programmed and erased in the dummy state PD.

Accordingly, because of an application of a program erase cycle about dummy cells, a threshold voltage of the dummy cells does not shift to an over-erased or over-programmed state. As a result, interference that memory cells receive from adjacent dummy cells can be prevented.

The above mentioned embodiments may be applied to various nonvolatile memory devices or may be modified. For example, the embodiments may be applied to three-dimensionally formed semiconductor memory devices. That is, based on the above-mentioned embodiments, dummy cells may be controlled in a semiconductor memory structure where a cell string is formed in a vertical structure.

Figure 11:
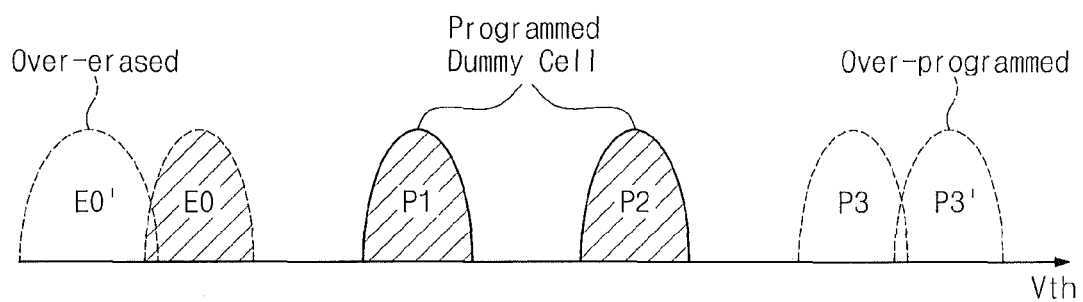
FIG. 11 is a view illustrating a threshold voltage distribution of dummy cells according to some embodiments of the present invention.

FIG. 11 is a view illustrating a threshold voltage distribution of dummy cells according to some embodiments of the present invention. A threshold voltage distribution of a 2-bit MLC is illustrated as an example to describe features of some embodiments disclosed herein.

In a case of a 2-bit MLC, memory cells for storing data are programmed with one of four programmed states (E0, P1, P2, and P3). That is, a threshold voltage of memory cells corresponds to one of four programmed states (E0, P1, P2, and P3) by a program operation. During an erase operation, a threshold voltage of the programmed memory cells shifts to an erased state E0. According to some embodiments of the present invention, a threshold voltage of dummy cells corresponds to one of an erased state E0 or programmed state P1 and P2 as indicated with slanted lines. During an erase operation, a threshold voltage of the dummy cells shifts to an erased state E0. However, when normal memory cells of the same page are programmed, dummy cells may be programmed with one of programmed states P1 and P2.

In a nonvolatile memory device, adjacent memory cells may have respectively different threshold voltages affecting each other. That is, floating gates of adjacent memory cells having respectively different threshold voltages may exchange interference. Interference may include program disturbance and/or lateral charge spreading. According to this inference between adjacent cells, a threshold voltage of a memory cell may be increased or decreased in an unintentional direction. This interference phenomenon may occur significantly between memory cells programmed with an erased state E0 and memory cells programmed with a programmed state P3 having the top threshold voltage.

Interference caused by dummy cells may become an issue in a flash memory device including the dummy cells. Dummy cells in series are connected between select transistors SST and GST. Dummy cells and select transistors SST and GST constitute one dummy string. Then, the dummy string is connected to a dummy bit line. The dummy string may be formed adjacent a normal string (a cell string having valid data). Memory cells in the normal string and memory cells in the dummy string may exchange mutual interference.

A dummy bit line may be connected to a PPW or may be configured to be maintained in a floating state. If a dummy bit line is connected to the PPW, dummy cells are programmed during a program operation. However, a program verify operation for dummy cells may not be provided. Accordingly, even if dummy cells are programmed with an appropriate voltage, they are not set as program inhibit. In this case, dummy cells may be programmed with the top state (e.g., P3) or a programmed state P3 higher than the top state. In addition, if dummy cells float electrically, they may not be programmed but may be exposed to a repetitive erase operation. If the dummy cells are exposed to the repetitive erase operation, a threshold voltage of the dummy cells may shift to an over-erased state E0'.

However, according to some embodiments of the present invention, a threshold voltage of the dummy cells is distributed in an erased state E0 and programmed states P1 and P2. Accordingly, general inter-cell interference such as program disturbance or lateral charge leakage can be prevented. Here, for convenience of description, a 2-bit MLC is illustrated by way of example. However, the same technical features may be applied to an MLC of more than 3 bits.

Figure 12:
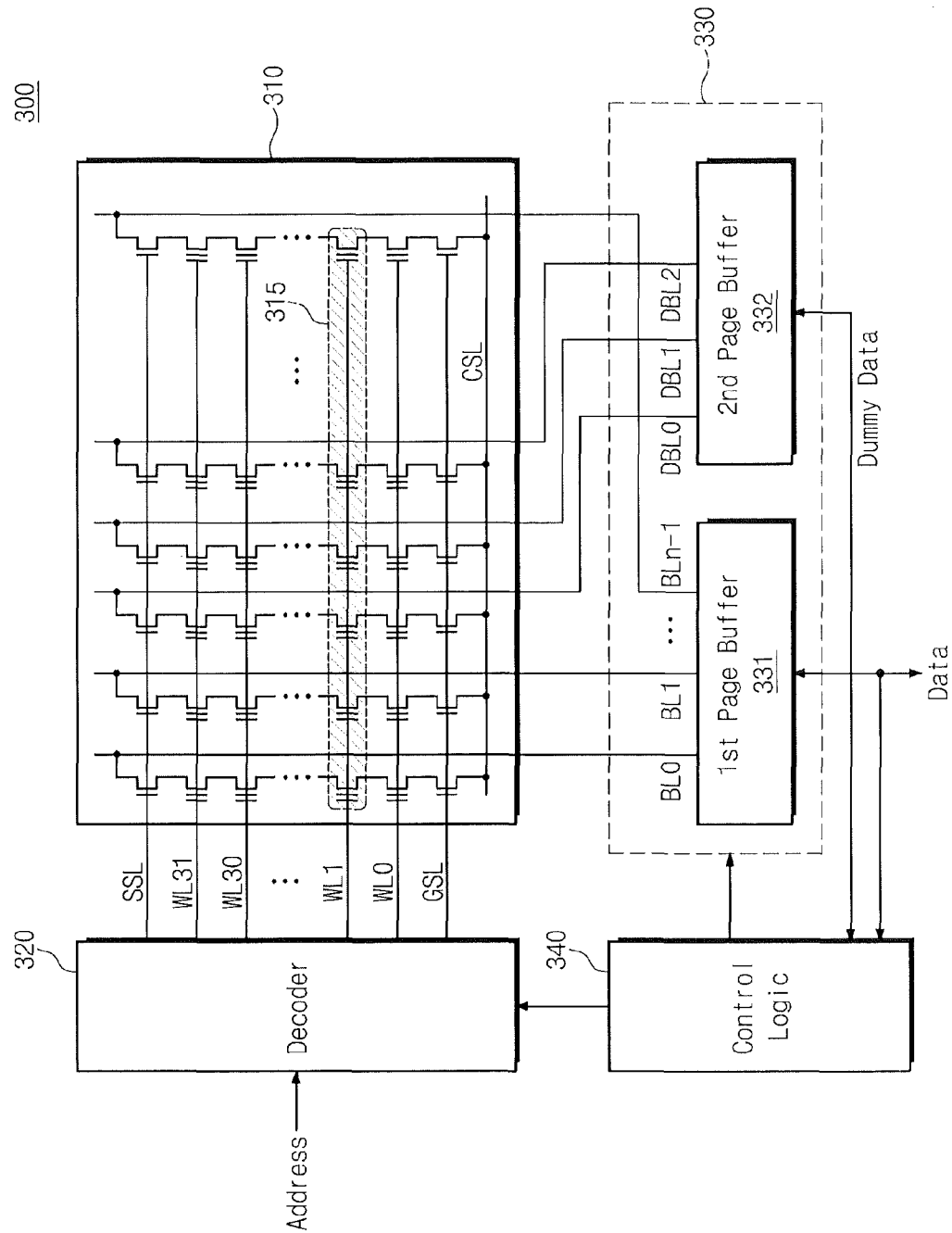
FIG. 12 is a block diagram illustrating a nonvolatile memory device according to some embodiments of the present invention.

FIG. 12 is a block diagram of a nonvolatile memory device 300 according to some embodiments of the present invention. Referring to FIG. 12, a nonvolatile memory device 300 includes a cell array 310, a decoder 320, a page buffer 330, and control logic 340. The page buffer 330 includes a second page buffer 332 connected to a dummy bit line.

The cell array 310 may include a plurality of memory blocks. One memory block is illustrated by way of example in FIG. 12. Each memory block may include a plurality of pages. Each page (for example, 315) may include a plurality of memory cells. In the nonvolatile memory device 300, an erase operation is performed by a memory block and a write or read operation is performed by a page unit. The cell array 310 may include dummy cells. The dummy cells are connected to the dummy lines DBL0, DBL1, and DBL2. The dummy cell does not store valid data.

The cell array 310 has a cell string structure. One cell string includes a string selection transistor SST connected to a string selection line SSL, a plurality of memory cells connected to a plurality of word lines WL0 to WL31, and a ground selection transistor GST connected to the ground selection line GSL. The string selection transistor SST is connected to a bit line BL and a ground selection transistor GST is connected to a common source line CSL.

A plurality of memory cells are connected to one word line WL1. A group of memory cells connected to one word line and programmed simultaneously is called a page typically. For example, when one page 315 is programmed, a program voltage Vpgm and a verify voltage are alternately provided to the word line WL1. Then, during a program operation, program data is provided to bit lines connected to the selected page 315. In order for a verify operation, bit lines connected to each memory cell of the selected page 315 are pre-charged. Then, a voltage shift of the pre-charged bit line is sensed. Based on the sensed voltage shift of the bit line, it is determined whether memory cells are programmed successfully or not.

The decoder 320 is connected to the cell array 310 through selection lines such as SSL, GSL, or word lines WL0 to WL31. During a program or read operation, the decoder 320 receives an address and selects one of word lines (for example WL1). In addition, the decoder 320 delivers a necessary voltage for a program or read operation to the selected word line WL1 or non-selected word line (except for WL1).

The page buffer 330 is connected to the cell array 310 through bit lines BL0 to BLn-1 and the dummy bit lines DBL0, DBL1, and DBL2. The page buffer 330 includes a first page buffer 331 connected to the bit lines BL0 to BLn-1. The first page buffer 331 delivers data to the selected page 315 during a program operation. During a program verify operation, the first page buffer 331 delivers data sensed through the bit lines BL0 to BLn-1 to the control logic 340. The first page buffer 331 reads data from the selected page 315 and outputs the read data to an external device during a read operation.

The second page buffer 332 is connected to the dummy lines DBL0, DBL1, and DBL2. The second page buffer 332 biases the dummy lines DBL0, DBL1, and DBL2 during a program operation. Dummy cells in the selected page 315 may be programmed with one of programmed states P1 and P2 by biasing of the dummy bit lines DBL0, DBL1, and DBL2. During a program verify operation, the second page buffer 332 delivers data sensed through the dummy bit lines DBL0, DBL1, and DBL2 to the control logic 340. During a read operation, a read operation of the second page buffer 332 may be deactivated.

The control logic 340 may control program, read, and erase operations of the nonvolatile memory device 300. For example, during a program operation, the control logic 340 controls the decoder 320 to provide a program voltage to a selected word line. The control logic 340 may control the page buffer 330 to provide program data to the selected page 315.

The control logic 340 controls the first page buffer 331 and the second page buffer 332 to deliver data to the bit lines BL0 to BLn−1 and the dummy bit lines DBL0, DBL1, and DBL2 during a program operation. During a program verify operation, the control logic 340 controls the first page buffer 331 and the second page buffer 332 to sense normal memory cells and dummy cells in the selected page 315. The verify data sensed from the first page buffer 331 and the second page buffer 332 are delivered to the control logic 340 again. The control logic 340 determines pass/fail about the selected page 315 with reference to the delivered verify data.

The nonvolatile memory device 300 according to some embodiments of the present invention programs dummy cells with programmed states P1 and P2 during a program operation. As a result, the nonvolatile memory device 300 may reduce interference phenomenon caused by dummy cells exposed to a repetitive erase operation. That is, a phenomenon that dummy cells are not programmed and exposed to a repetitive erase operation to shift to an over-erased state E0' can be prevented. The nonvolatile memory device 300 may prevent a phenomenon that dummy cells are programmed with an over-programmed state or the top state P3 during a program operation. Through the second page buffer 332 connected to the dummy bit line, interference that dummy cells provide adjacent normal cells may be prevented.

Figure 13:
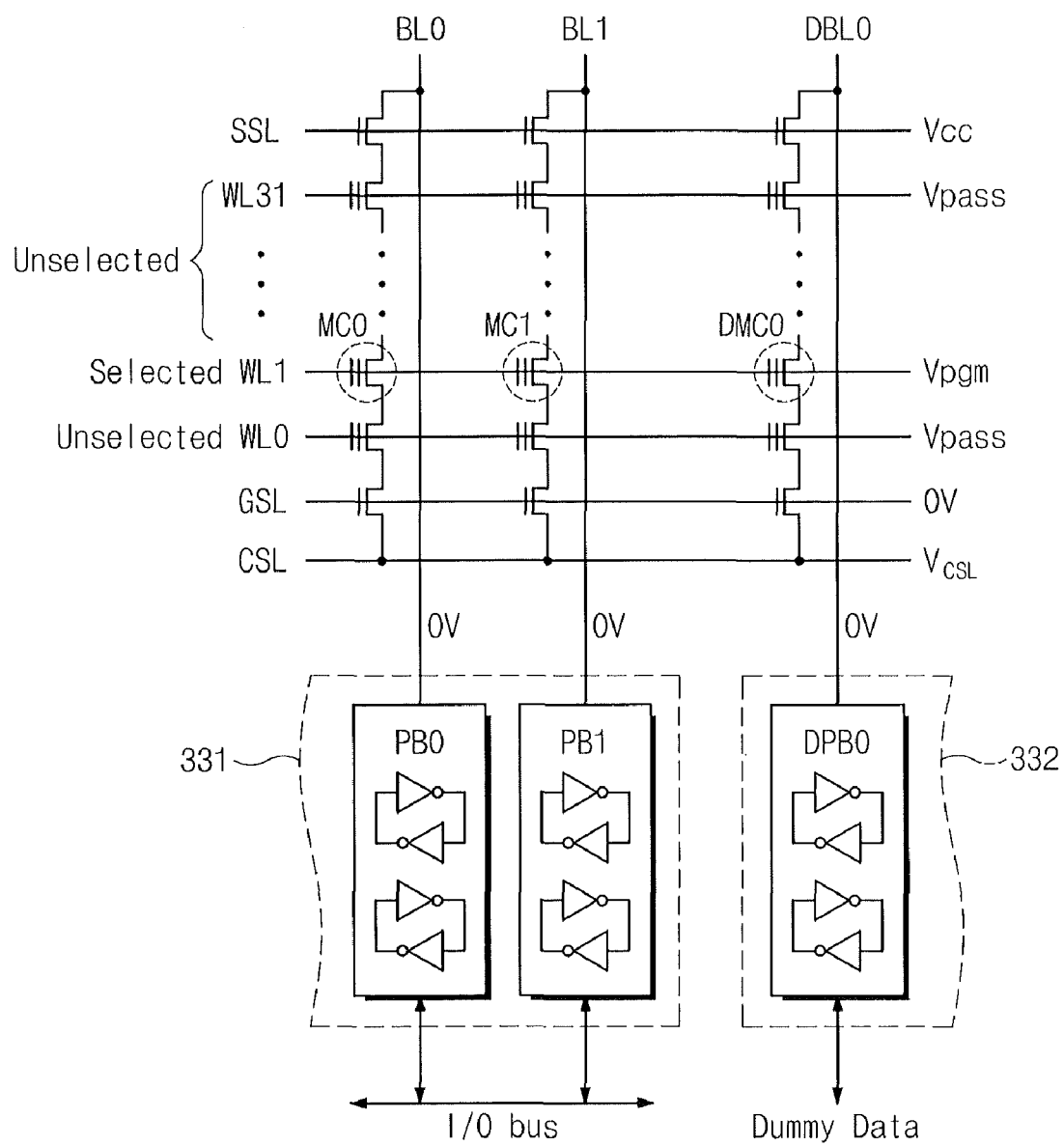
FIG. 13 is a circuit diagram illustrating a cell array and a page buffer of FIG. 12.

FIG. 13 is a view illustrating the cell array 310 and the page buffer 330 of the nonvolatile memory device 300 of FIG. 12. The first page buffer 331 includes page buffer circuits PB0 and PB1 connected to bit lines BL0 and BL1 of normal cell strings. The second page buffer 332 is connected to the dummy line DBL0 connected to a dummy cell string. The page buffer circuits PB0 and PB1 in the first page buffer 331 may have the same structure as the page buffer circuit DPB0 in the second page buffer 332.

During a program operation, a power voltage Vcc may be provided to a string selection line SSL, a ground voltage (e.g., 0 V) may be provided to a ground selection line GSL, and a source line voltage VCSL (e.g., about 2 V) may be provided to a common source line CSL. Then, the page buffer circuit PB0 applies a ground voltage (or, 0 V) to the program bit line BL0. The page buffer circuit PB1 applies a power voltage Vcc to the program bit line BL1. In addition, the page buffer circuit PB0 applies a ground voltage (or, 0 V) to the dummy bit line DBL0. During this state, a pass voltage Vpass or a program voltage Vpgm is applied to the word lines.

Then, a memory cell MC0 selected by the page buffer circuit PB0 may be programmed with one of programmed states P1, P2, and P3. In contrast, the selected memory cell MC1 maintains a previous state. The selected dummy cell DMC0 may be programmed with one of programmed states P1 and P2 according to a control of the page buffer circuit DPB0.

The above-mentioned buffer circuits PB0 and PB1 may receive program data from an external device. Program data may be provided to the buffer circuits PB0 and PB1 through an input/output (I/O) bus. Additionally, the page buffer circuits PB0 and PB1 deliver data sensed through the bit lines BL0 and BL1 to the control logic 340 of FIG. 12 during a program verify operation.

In contrast, the page buffer circuit DPB0 loads dummy data provided from the control logic 340 or a fuse option (not shown) into inner latches. Then, the page buffer circuit DPB0 biases the dummy bit line DBL0 according to the loaded dummy data. The page buffer circuit DPB0 delivers data sensed through the dummy bit line DBL0 to the control logic 340 during a program verify operation.

During an erase operation, word lines are biased to 0 V and the selection lines SSL and GSL are biased to electrically float. Then, the bit lines BL0, BL1 and DBL0 and the common source line CSL are biased to a floating state. During the above bias state, if an erase voltage Verase is applied to the PPW, dummy cells or normal memory cells in a block are erased.

During a read operation, a selection read voltage Vrd is provided to a selection word line and a non-selection read voltage Vread is provided to the non-selection word lines and selection lines SSL and GSL. Then, a common source line CSL and a dummy bit line DBL may be biased to 0 V. During this bias state, bit lines are sensed. However, data of a dummy cell sensed through the dummy bit line DBL0 is not related to data requested for a write operation from an external device. Accordingly, dummy data sensed from dummy cells may be configured not to be outputted to the external of the nonvolatile memory device 300.

Figure 14:
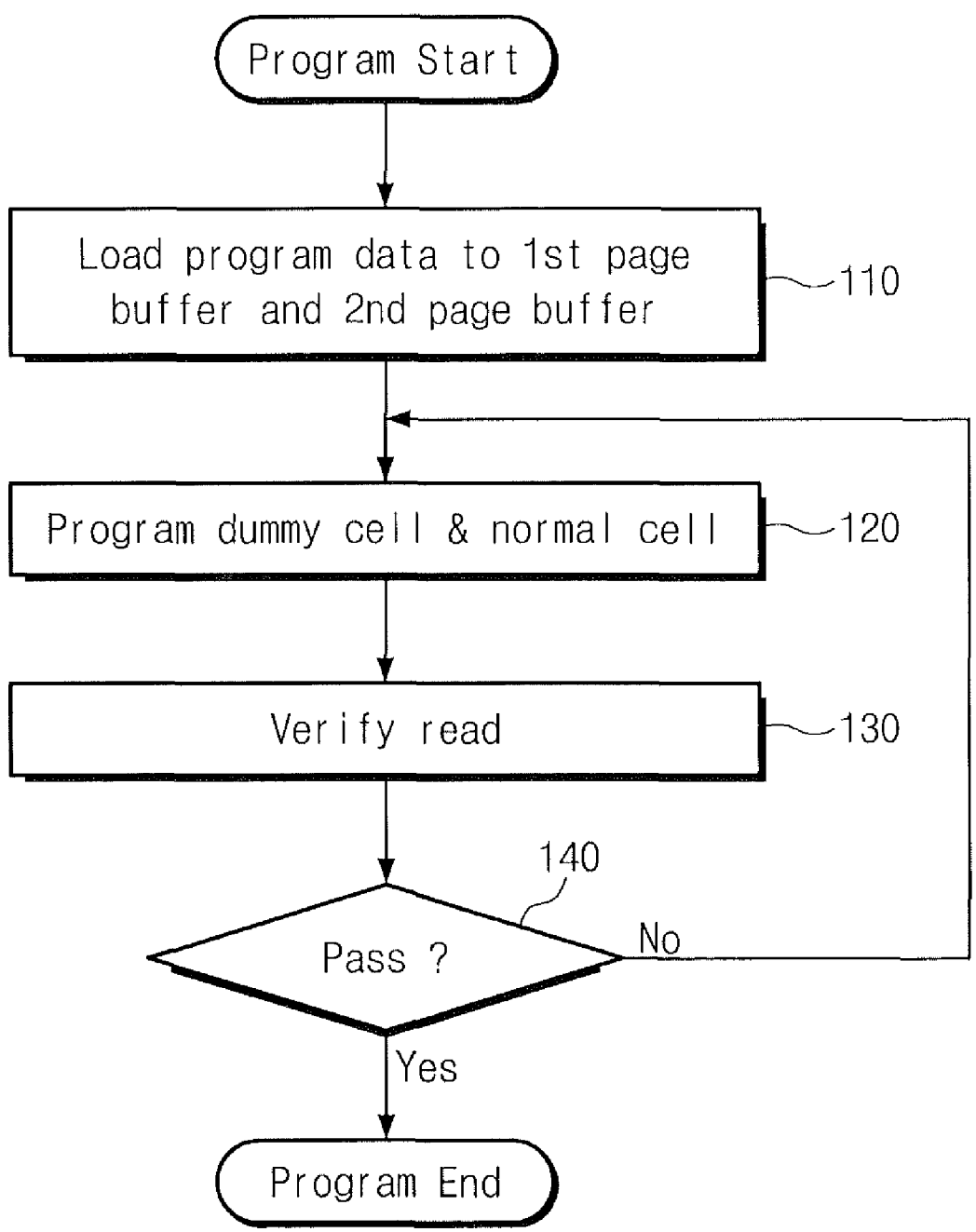
FIG. 14 is a flowchart illustrating a programming method according to some embodiments of the present invention.

FIG. 14 is a flowchart illustrating programming methods of the nonvolatile memory device 300 of FIG. 12. During a program operation, dummy cells may be programmed by a page buffer connected to a dummy bit line. Once a program operation starts, according to control of the control logic 340 of FIG. 12, program data and dummy data are loaded into the first page buffer 331 and the second page buffer 332 (block 110). The dummy data has a logic value for programming a dummy cell with an over-programmed state P3' or programmed states (for example, P1 and P2) lower than the top programmed state P3.

Normal memory cells and dummy cells are programmed in a bias state of FIG. 13 (block 120). Some embodiments provide that normal memory cells may be programmed with one of programmed states P1, P2, and P3. However, dummy memory cells may be programmed with one of programmed states P1 and P2. In a case of 3-bit MLC, dummy memory cells may have seven programmed states P1 to P7. Dummy memory cells may be programmed with one of programmed states P1 to P6. Herein the programmed state P7 corresponds to the top threshold voltage distribution among the programmed states P1 to P7.

In a case of 4-bit MLC, dummy memory cells may have fifteen programmed states P1 to P14. Dummy cells may be configured to be programmed with one of the programmed states P1 to P14. Here, the programmed state P15 corresponds to the top threshold voltage distribution among the programmed states P1 to P15. A programmed state Pn (n is a natural number) with which dummy cells are programmed may be configured to be in a state where interference about adjacent normal memory cells is minimized.

A verify read operation about the programmed normal memory cells and dummy cells is performed (block 130). A verify voltage is provided to a word line of a selected page. Then, the first page buffer 331 and the second page buffer 332 sense connected bit lines, respectively. The sensed data may be temporarily stored in the first page buffer 331 and the second page buffer 332 and then are delivered to the control logic 340.

It is determined whether the memory cells sensed by a verify read operation are programmed or not (block 140). If any one of the selected memory cells (normal memory cells and dummy cells) is determined as program fail, operations for programming the selected page are performed again (block 120). However, if all the selected memory cells (normal memory cells and dummy cells) are determined as program pass, general program operations are terminated.

Figure 15:
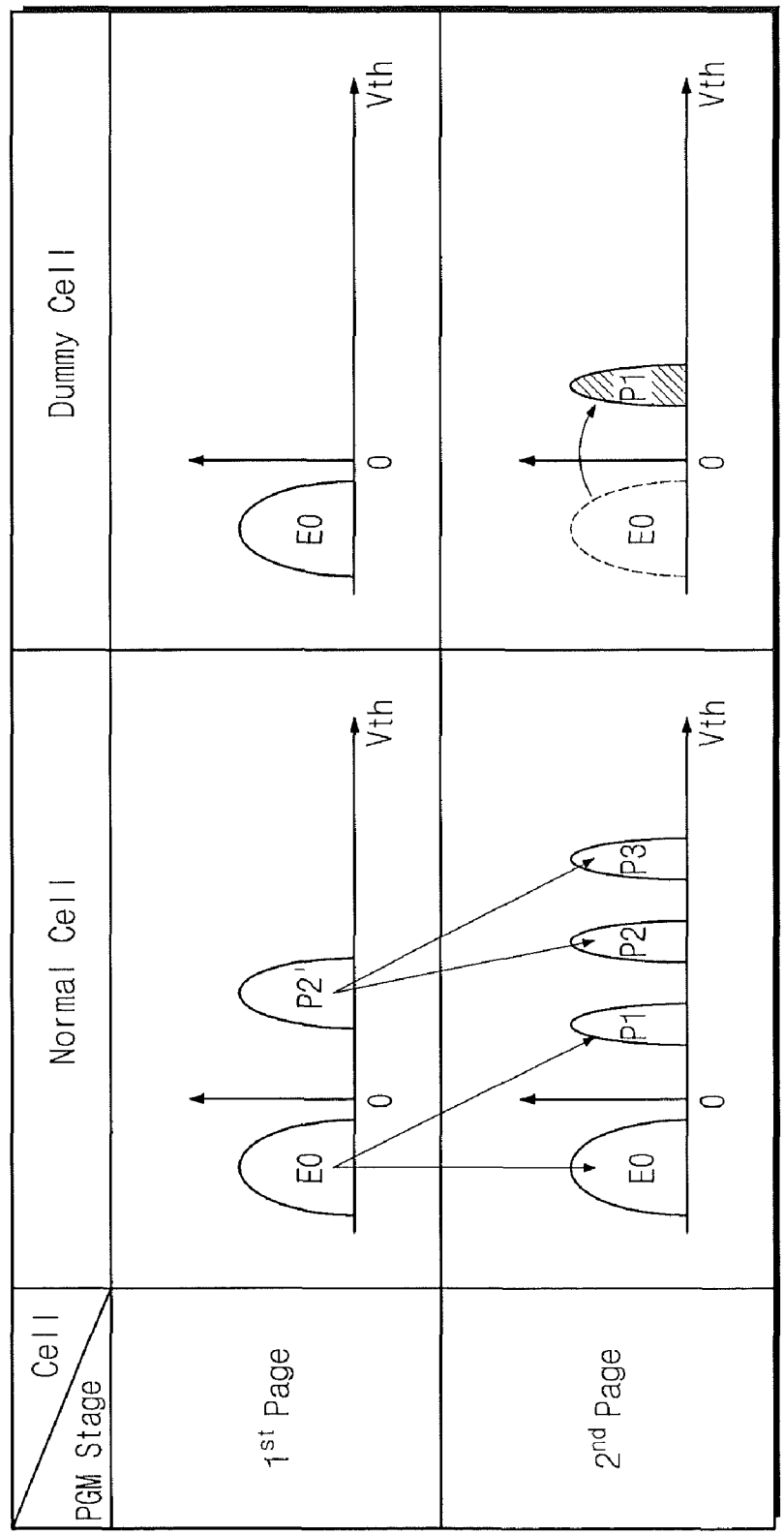
FIG. 15 is a table illustrating one example of a program procedure according to some embodiments of the present invention.

FIG. 15 is a table illustrating an example that dummy cells are programmed by the program operations of FIG. 14. By way of non-limiting example, the program operations are described using a 2-bit MLC.

During programming of a first page (or, an LSB page), normal memory cells may be programmed with an erased state E0 or a programmed state P2'. The erased state E0 represents a threshold voltage distribution of program-inhibited memory cells among normal memory cells. During a program operation, a power voltage Vcc may be applied to a bit line of the program-inhibited memory cells. The programmed state P2' represents a target distribution of memory cells to be programmed among normal memory cells. During a program operation, a ground voltage 0 V is applied to a bit line of memory cells programmed with the programmed state P2'.

During the programming of the first page (or, an LSB page), all dummy cells are biased to program inhibit. That is, during the programming of the first page (or, an LSB page), a second page buffer 332 may apply a power voltage Vcc to a dummy bit line. In this regard, during the programming of the first page (or, an LSB page), logic 1 may be loaded into page buffer circuits of the second page buffer 332. According to the programming result of the first page (or, an LSB page), dummy cells may maintain an erased state E0.

During programming of a second page (or, an MSB page), normal memory cells may be programmed with an erased state E0 or one of programmed states P1, P2, and P3. In contrast, during the programming of the second page (or, an MSB page), all dummy cells are programmed with a programmed state P1. That is, during the programming of the second page (or, an MSB page), the second page buffer 332 may apply a ground voltage (0 V) to dummy bit lines. In this regard, during the programming of the second page (or, an MSB page), logic 0 may be loaded into page buffer circuits of the second page buffer 332. According to the programming result of the second page (or, an MSB page), all dummy cells are programmed with a programmed state P1.

If all dummy cells are programmed with a programmed state P1, interference that normal memory cells receive from adjacent dummy cells can be significantly reduced.

Figure 16:
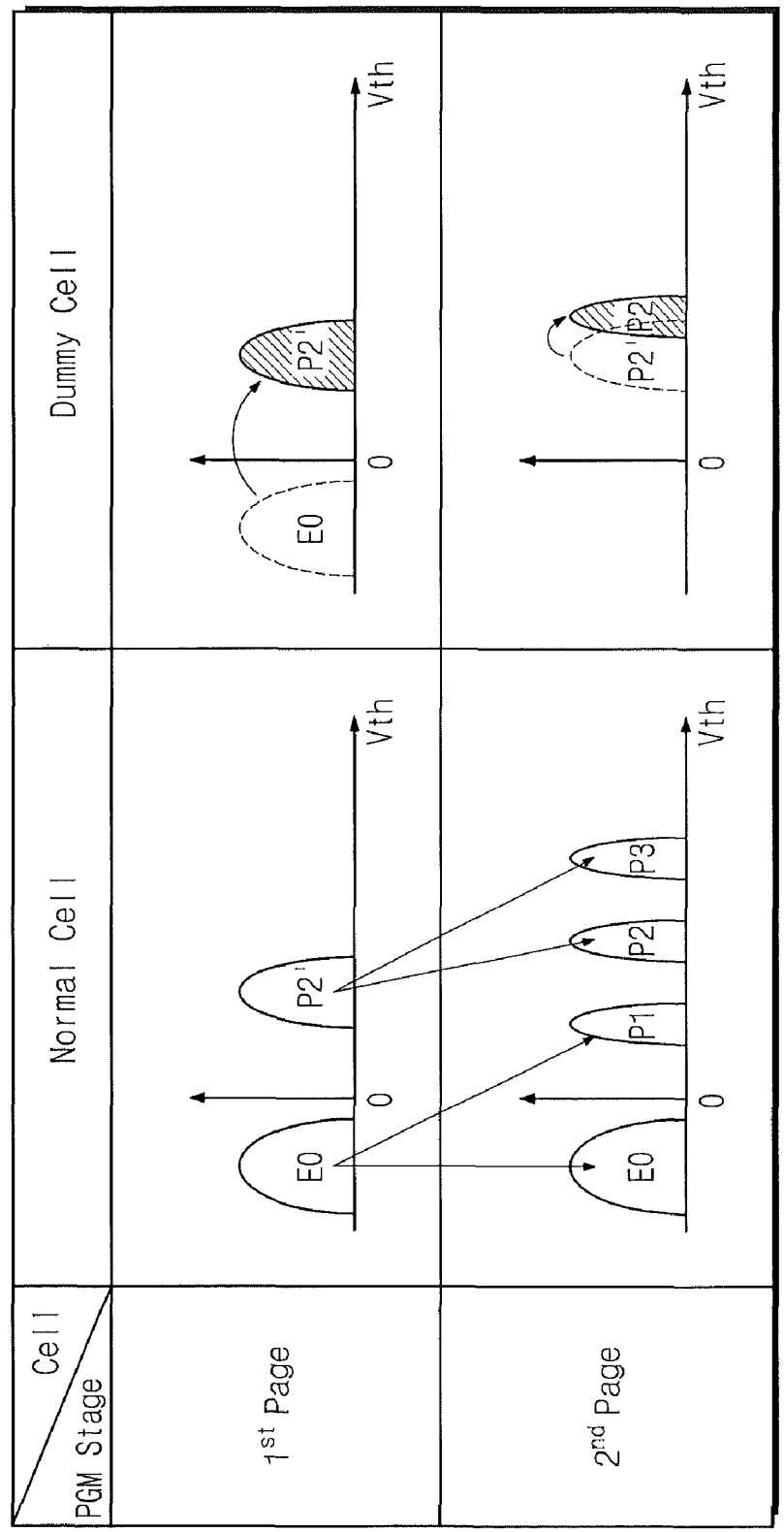
FIG. 16 is a table illustrating another example of a program procedure according to some embodiments of the present invention.

FIG. 16 is a table illustrating another example of dummy cells that are programmed by the program operations of FIG. 14. During programming of a first page (or, an LSB page), normal memory cells may be programmed with an erased state E0 or a programmed state P2'. The erased state E0 represents a threshold voltage distribution of program-inhibited memory cells among normal memory cells. During a program operation, a power voltage Vcc may be applied to a bit line of the program-inhibited memory cells. The programmed state P2' represents a target distribution of memory cells to be programmed among normal memory cells. During a program operation, a ground voltage 0 V is applied to a bit line of memory cells programmed with the programmed state P2'.

During the programming of the first page (or, an LSB page), all dummy cells are programmed with a programmed state P2'. That is, during the programming of the first page (or, an LSB page), a second page buffer 332 may apply a ground voltage (0 V) to dummy bit lines. For this, during the programming of the first page (or, an LSB page), logic 0 may be loaded into page buffer circuits of the second page buffer 332.

During programming of a second page (or, an MSB page), normal memory cells may be programmed with an erased state E0 or one of programmed states P1, P2, and P3. During the programming of the second page (or, an MSB page), all dummy cells are programmed with a programmed state P2.

The embodiments of FIGS. 15 and 16 illustrate a programming timing of dummy cells during a program operation of an MLC. Specifically, FIG. 15 illustrates an example in which dummy cells are programmed into a target state during a program operation of an MSB page. In contrast, FIG. 16 illustrates an example in which dummy cells are programmed into a target state during a program operation of an LSB page. The programming methods of dummy cells of FIGS. 15 and 16 are non-limiting examples of some embodiments of the present invention. In this regard, some embodiments may be similarly applied to an MLC having 3 or more bits.

Figure 17:
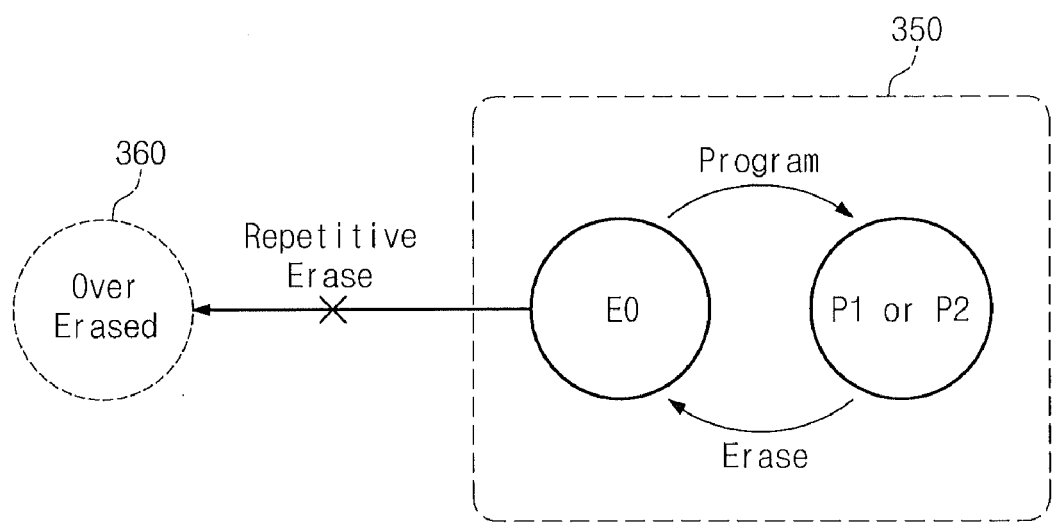
FIG. 17 is a view illustrating an effect of some embodiments of the present invention.

FIG. 17 is a view illustrating a state transition property of dummy cells according to some embodiments of the present invention. Referring to FIG. 17, dummy cells of the nonvolatile memory device 300 may be prevented from a repetitive erase operation. Here, the repetitive erase operation means that dummy cells are continuously exposed only during a block erase operation. Accordingly, a phenomenon that dummy cells are erased with an over-erased state 360 may be fundamentally prevented. That is, in relation to charge-trap type flash memory, excessive holes are injected in a charge trap layer of dummy cells, such that a phenomenon that affects a charge trap layer of adjacent normal memory cells may be prevented. Also, though not illustrated in the drawings, a phenomenon that dummy cells are programmed with the top state (for example, P3) and/or an over-programmed state may be prevented. Moreover, a phenomenon that dummy cells are programmed with the top state (for example, P3) and/or an over-programmed state may be prevented.

In the nonvolatile memory device 300 according to some embodiments of the present invention, a state transition 350 occurs only between an erased state E0 and programmed states P1 and P2 of dummy cells.

Embodiments as disclosed herein may be applied to various nonvolatile memory devices and/or may be modified. For example, some embodiments may be applied to three-dimensionally formed semiconductor memory devices. That is, based on the embodiments disclosed herein, dummy cells may be controlled in a semiconductor memory structure where a cell string is formed in a vertical structure.

Figure 18:
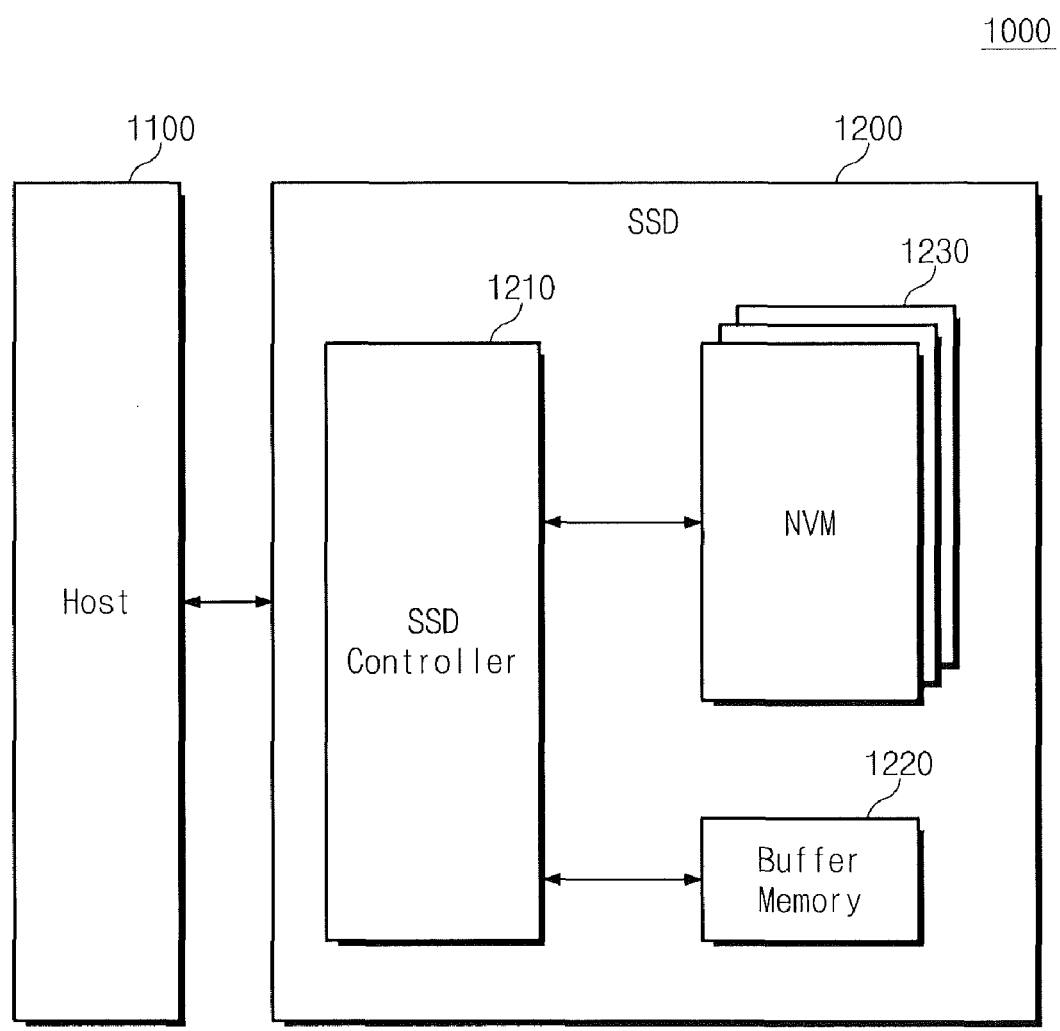
FIG. 18 is a block diagram illustrating an SSD including a nonvolatile memory device according to some embodiments of the present invention.

FIG. 18 is a block diagram of a solid state drive (SSD) system including a nonvolatile memory device according to some embodiments of the present invention. Referring to FIG. 18, the SSD system 1000 includes a host 1100 and an SSD 1200. The SSD 1200 includes an SSD controller 1210, a buffer memory 1220, and a nonvolatile memory device 1230.

The SSD controller 1210 provides a physical connection between the host 1100 and the SSD 1200. That is, the SSD controller 1210 provides an interface to the SSD 1200 in correspondence to a bus format of the host 1100. Some embodiments provide that the SSD controller 1210 decodes a command provided from the host 1100. According to a decoded result, the SSD controller 1210 accesses the nonvolatile memory device 1230. The bus format of the host 1100 may include Universal Serial Bus (USB), small Computer System Interface (SCSI), PCI express, Advanced Technology Attachment (ATA), Parallel ATA (PATA), Serial ATA (SATA), and/or Serial Attached SCSI (SAS), among others.

The buffer memory 1220 temporarily stores write data provided from the host 1100 and data read from the nonvolatile memory device 1230. If data of the nonvolatile memory device 1230 is cached during a read request of the host 1100, the buffer memory 1220 supports a cache function for providing the cached data to the host 1100 directly. In general, a data transfer rate of the bus format (for example, SATA or SAS) of the host 1100 may be significantly faster than that of a memory channel of the SSD 1200. In this regard, if an interface speed of the host 1100 is significantly faster, performance deterioration due to a speed difference can be minimized by providing a high capacity of the buffer memory 1220.

The buffer memory 1220 may be provided with a synchronous DRAM for providing sufficient buffering in the SSD 1200, which may be used as a high capacity auxiliary memory device. However, it is apparent to those skilled in the art that the buffer memory 1220 is not limited to the above.

The nonvolatile memory device 1230 may be provided as a storage medium of the SSD 1200. For example, the nonvolatile memory device 1230 may be provided with a NAND-type flash memory having a high data storage capacity. The nonvolatile memory device 1230 may be configured with a plurality of memory devices. In this case, each memory device may be connected to the SSD controller 1210 by a channel unit. Some embodiments of the nonvolatile memory device 1230 as a storage medium may include a NAND flash memory and/or other nonvolatile memory devices and/or types of devices. For example, PRAM, MRAM, ReRAM, FRAM, and/or NOR flash memories may be used as storage medium and may be applied to a memory system with different kinds of memory devices. Some embodiments provide that a volatile memory device (for example, DRAM) may be included as a storage medium.

In FIG. 18, at least one nonvolatile memory device 1230 may include one of the nonvolatile memory devices 100, 200, and/or 300 of FIGS. 2, 7, and 12.

Figure 19:
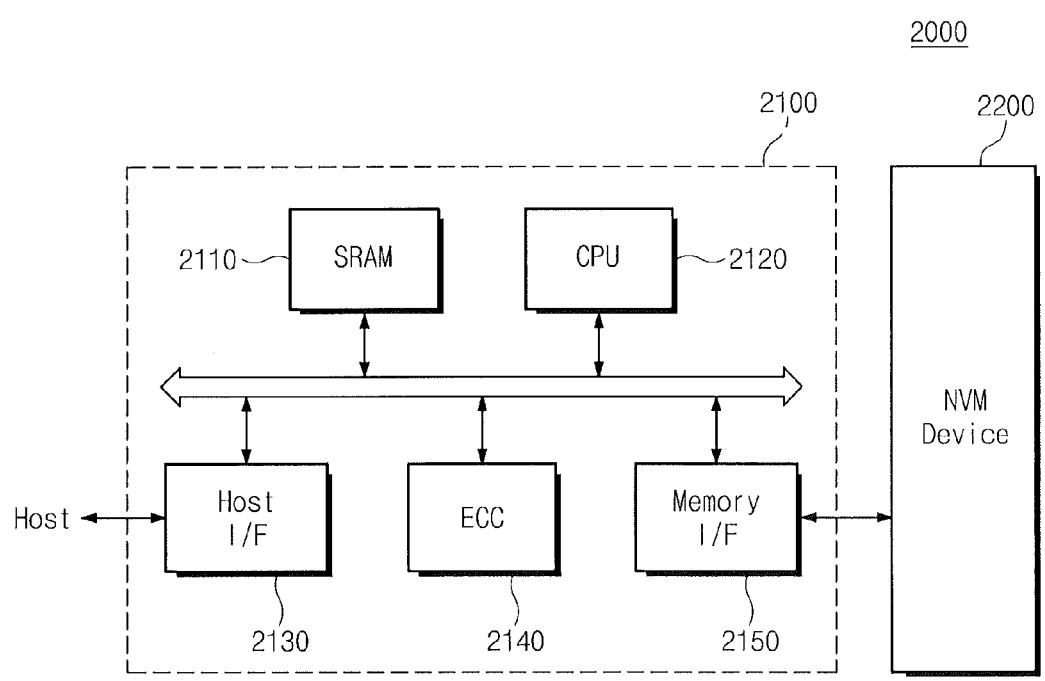
FIG. 19 is a block diagram illustrating a memory system including a nonvolatile memory device according to some embodiments of the present invention.

FIG. 19 is a block diagram illustrating a memory system 2000 according to some embodiments of the present invention. Referring to FIG. 19, the memory system 2000 according to some embodiments includes a nonvolatile memory device 2200 and a memory controller 2100.

The nonvolatile memory device 2200 may be one of the nonvolatile memory devices 100, 200, and/or 300 of FIGS. 2, 7, and 12. The memory controller 2100 is configured to control the nonvolatile memory device 2200. The nonvolatile memory device 2200 and the memory controller 110 may be combined to be provided as a memory card or a semiconductor disk device (for example, a solid state disk (SSD)). A SRAM 2110 is used as an operating memory of a central processing unit (CPU) 2120. A host interface 2130 includes a data exchange protocol of a host connected to the memory system 2000. The error correction code block 2140 detects and corrects an error in data read from the nonvolatile memory device 2200. The memory interface 2150 interfaces with the nonvolatile memory device 2200. The CPU 2120 performs general control operations for data exchange of the memory controller 2100. Although not illustrated in the drawings, the memory system 2000 may further include ROM (not shown) for storing code data to interface with a host. The nonvolatile memory device 2200 may be provided with a multi chip package including a plurality of flash memory chips. The memory system 2000 may be provided as storage medium with high reliability (i.e., low error occurrence probability). As disclosed herein, a memory system such as a SSD may include the flash memory device according to some embodiments of the present invention. In this case, the memory controller 2100 is configured to communicate with an external (e.g., a host) through one of interface protocols such as USB, MMC, PCI-E, SATA, PATA, SCSI, ESDI, and/or IDE, among others. In addition, the memory controller 2100 may further include a configuration for performing a random operation.

Figure 20:
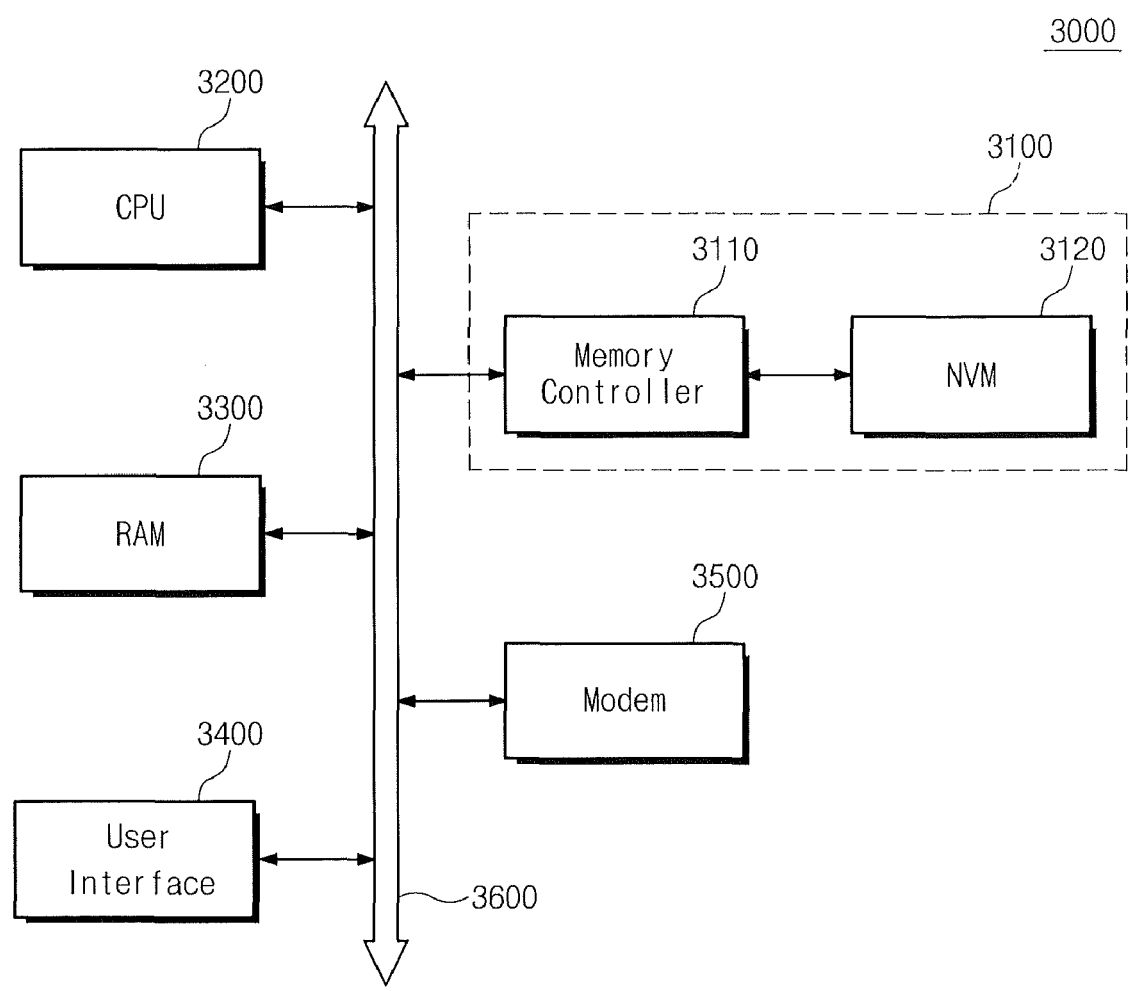
FIG. 20 is a block diagram illustrating a computing system including a nonvolatile memory device according to some embodiments of the present invention.

FIG. 20 is a view illustrating a computing system 3000 including a nonvolatile memory device 3120 according to some embodiments of the present invention. The computing system 3000 includes a CPU 3200, a RAM 3300, a user interface 3400, a modem 3500 such as a baseband chipset, and a memory system 3100, which are electrically connected through a system bus 3600. The memory system 3100 may have the same configuration as that of FIG. 19. If the computing system 3000 is a mobile device, a battery (not shown) may be additionally provided to supply an operating voltage of the computing system 3000. Although not illustrated in the drawings, it is apparent to those skilled in the art that the memory system 3000 may further include an application chipset, a camera image processor (CIS), and/or a mobile DRAM, among others. The memory system 3100 may include an SSD using a nonvolatile memory to store data. Some embodiments provide that the memory system 3100 may be provided as a fusion flash memory (e.g., one NAND flash memory).

In addition, the flash memory devices and/or the memory systems according to embodiments of the present invention may be mounted using various kinds of packages. Examples of the packages of the flash memory devices and/or the memory systems include Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP), among others.

According to some embodiments, interference caused by a dummy bit line and dummy cells may be prevented such that nonvolatile memory devices having high reliability can be provided.

The embodiments described herein are considered to be illustrative and not restrictive. Accordingly, the appended claims are intended to cover all such modifications, enhancements, and other embodiments, which fall within the true spirit and scope of the present invention. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A nonvolatile memory device, comprising:
a plurality of dummy cells connected to a dummy bit line; and
a dummy bit line bias circuit providing a dummy bit line voltage to the dummy bit line during a program operation,
wherein, due to the dummy bit line voltage, at least one of the plurality of dummy cells is programmed with a threshold voltage lower than the top programmed state and higher than an erased state during the program operation.

2. The device of claim 1, wherein the dummy bit line voltage is lower than a gate voltage of a selection transistor for selecting the plurality of dummy cells during the program operation.

3. The device of claim 2, wherein the dummy bit line voltage is higher than a ground voltage during the program operation.

4. The device of claim 1, wherein the dummy bit line voltage is the same as a common source line voltage for providing a source voltage of the plurality of dummy cells during the program operation.

5. The device of claim 4, wherein the dummy line bias circuit is a common source line circuit for providing the common source line voltage.

6. The device of claim 1, wherein the dummy bit line bias circuit maintains the dummy bit line in a floating state during an erase operation.

7. The device of claim 1, wherein the dummy bit line bias circuit provides a ground voltage (0 V) to the dummy bit line during a read operation.

8. The device of claim 1, further comprising a control logic that is operative to control a bias operation on a dummy bit line of the dummy bit line bias circuit according to an operating mode.

9. The device of claim 1, wherein data stored by programming of the plurality of dummy cells is invalid.

10. The device of claim 1, wherein a read operation on the plurality of dummy cells is blocked.

11. A method of biasing a nonvolatile memory device, the method comprising:
providing a first voltage to a dummy bit line connected to a dummy cell;
applying a program voltage to a gate of the dummy cell;
applying the first voltage to a drain of the dummy cell through a selection transistor; and
applying the second voltage to a gate of the selection transistor;
wherein the first voltage is lower than a second voltage provided to a bit line of a cell string that is to be program-inhibited.

12. The method of claim 11, wherein the first voltage is higher than a third voltage provided to a bit line of a cell string that is to be programmed.

13. The method of claim 11, wherein a source of the dummy cell is electrically disconnected to a common source line.

14. The method of claim 13, wherein the first voltage is the same as a voltage of the common source line.

15. A nonvolatile memory device comprising:
a dummy cell connected to a dummy bit line;
a page buffer connected to the dummy bit line; and
control logic that is operable to load dummy data into the page buffer connected to the dummy bit line during a program operation so that the dummy cell is programmed with a programmed state lower than the top programmed state and lower than an erased state.

16. The device of claim 15, wherein the dummy data is generated by the control logic.

17. The device of claim 15, wherein the page buffer connected to the dummy bit line senses the dummy bit line to verify whether the dummy cell is programmed with the programmed state or not during the program operation.

18. The device of claim 17, wherein the control logic is operable to determine whether the dummy cell is programmed with the programmed state or not with reference to the sensing result outputted from the page buffer connected to the dummy bit line.

19. The device of claim 18, wherein the control logic is operable to terminate the program operation of the dummy cell when it is determined that the dummy cell is programmed with the programmed state.

* * * * *